United States Patent [19]

Lee

[11] 4,375,625
[45] Mar. 1, 1983

[54] SWITCHED-CAPACITOR SOURCE RESISTOR SIMULATION CIRCUIT

[75] Inventor: Man S. Lee, San Mateo, Calif.

[73] Assignee: GTE Automatic Electric Laboratories, Inc., Northlake, Ill.

[21] Appl. No.: 265,882

[22] Filed: May 21, 1981

[51] Int. Cl.$^3$ .......................................... H03H 11/40
[52] U.S. Cl. .................................. 333/213; 328/128; 328/167; 330/107; 333/217
[58] Field of Search ............... 333/213, 173, 214, 216, 333/217; 328/127, 128, 167; 307/494, 497, 520; 330/107; 364/802

[56] References Cited

U.S. PATENT DOCUMENTS

| | | | |
|---|---|---|---|
| 4,179,665 | 12/1979 | Gregorian | 328/167 X |
| 4,315,227 | 2/1982 | Fleischer et al. | 333/173 |
| 4,331,894 | 5/1982 | Gregorian et al. | 307/497 X |
| 4,333,064 | 6/1982 | Kato et al. | 333/173 |
| 4,352,069 | 9/1982 | Dessoulavy | 328/127 |

OTHER PUBLICATIONS

Lee, *Improved Circuit Elements for Switched-Capacitor Ladder Filters*, Electronics Letters, Feb. 14, 1980, vol. 16, No. 4, pp. 131-133.

*Primary Examiner*—Paul L. Gensler
*Attorney, Agent, or Firm*—Russell A. Cannon

[57] ABSTRACT

An integratable circuit that simulates a source resistor comprises first and second nodes for connection to a voltage source and a virtual ground, respectively; a first integrated capacitor C1; and switch means operative for alternately electrically connecting C1's top and bottom plates to the first node and ground, respectively, and to ground and the second node, respectively, during first and second non-overlapping time periods in each time interval T for charging C1 to the source voltage and discharging C1 into the second node, respectively, where T is the time interval between adjacent second time periods and f=1/T is the switching frequency for C1. The switch means also operates for making similar connections to plates of second and third capacitors C2 and C3 in different time periods of ones of successive time intervals T, both C2 and C3 sampling a source voltage in synchronism with sampling by C1 during adjacent time intervals and holding a charge voltage for a time interval T prior to being discharged into the second node. The circuit simulates a source resistor when the first node is electrically connected to the output terminal of a voltage source that is connected to ground. This circuit configuration simulates a bilinear source resistor when the capacitances are the same values and the circuit is characterized by the bilinear transformation.

14 Claims, 2 Drawing Figures

SWITCHED-CAPACITOR SOURCE RESISTOR SIMULATION CIRCUIT

BACKGROUND OF INVENTION

This invention relates to switched capacitor circuits or networks and more particularly to a switched capacitor circuit replacement for a source resistor.

There is currently much interest in the simulation of resistors with switched capacitor circuits so that filters and networks can be implemented in fully integrated circuit form. A switched capacitor circuit that is particularly useful for simulating a source resistor in a direct ladder filter is described in "Improvement Circuit Elements for Switched-Capacitor Ladder Filters" by Man Shek Lee, Electronics Letters, Feb. 14, 1980, Vol. 16, No. 4, Pages 131-133. The simulation circuit there requires a voltage follower and is sensitive to top plate parasitic capacitance effects.

An object of this invention is the provision of a switched capacitor source resistor that is particularly useful in a multiple feedback ladder simulation circuit.

SUMMARY OF INVENTION

In accordance with this invention, an integratable switched capacitor circuit for simulating a source resistor across first and second nodes thereof, when the first node is electrically connected to a voltage source and the second node is connected to a virtual ground, comprises: switch means operative for periodically electrically connecting one and other plates of a first capacitor C1 between ground and the first node, and between the second node and ground, respectively, during first and second non-overlapping time periods in each time interval T for charging C1 with the source voltage and discharging C1 into the second node, where T is the time interval between adjacent terminations of successive second time periods and $f=1/T$ is the switching frequency for C1; said switch means also being operative for periodically making similar electrical connections to the one and other sides of a second capacitor C2 for charging C2 with the source voltage in synchronism with sampling thereof by C1 in one time interval, C2 holding a charge voltage for a time interval T prior to discharging into the second node in synchronism with a discharge of C1. In an alternate embodiment, the switch means is operative for making similar electrical connections to the one and other sides of a third capacitor C3 for charging C3 with the source voltage in synchronism with sampling thereof by C1 in a time interval adjacent said one time interval, C3 holding a charge voltage for a time interval T prior to discharging into the second node in synchronism with discharge of C1. The circuit simulates a bilinear source resistor when the capacitances are the same values and the circuit is characterized by the bilinear transformation.

DESCRIPTION OF DRAWING

This invention will be more fully understood from the following detailed descriptions of preferred embodiments thereof, together with the drawing in which.

DESCRIPTION OF PREFERRED EMBODIMENTS

Figure 1:
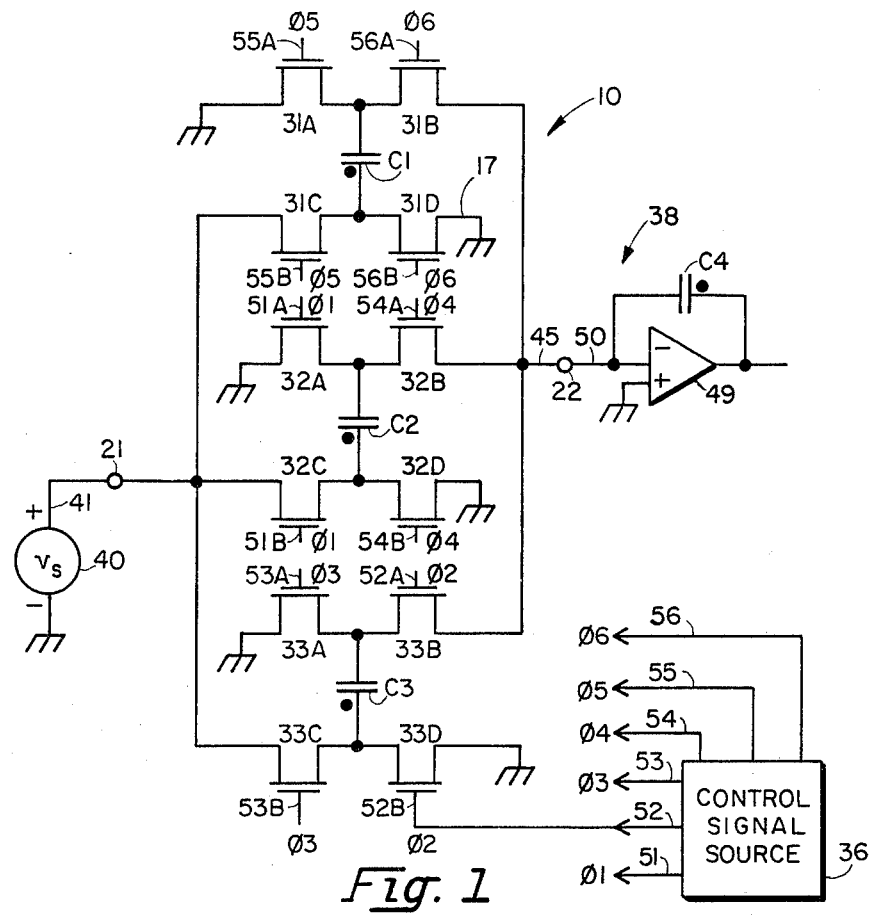
FIG. 1 is a schematic circuit diagram of a preferred embodiment of this invention for implementation in integrated circuit form.

Referring now to a preferred embodiment of this invention in FIG. 1 that is implemented in integrated circuit form, a switched capacitor circuit or network 10 for simulating a source resistor across a pair of terminals or nodes 21 and 22 thereof comprises: integrated-switched capacitors C1, C2 and C3; a plurality of switch means 31, 32 and 33 that are associated with switched capacitors C1, C2 and C3; a source 36 of timing control signals; and an integrator 38. The dots on the integrated capacitors indicate the top plates thereof.

The input node 21 of the simulation circuit 10 is connected to the output terminal 41 of a voltage source 40 that has a very low output impedance, provides whatever output current is demanded by external circuitry, and is associated with the ground reference potential. The output node 22 of the simulation circuit is connected to the inverting input of a differential input operational amplifier 49 type of voltage source in the integrator 38 which is the other element of an active RC integrator. The non-inverting input of the amplifier is connected to ground for requiring its inverting input line 50 to impress a virtual ground potential on node 22. Since the amplifier 49 is a voltage source having a very low input impedance which is substantially zero ohms, this makes the circuit substantially insensitive to both top and bottom plate parasitic capacitance effects of C4.

In an embodiment of the circuit 10 that was implemented with MOS technology, each of the switch means 31-33 comprises two pairs of MOS FET transistors. Considering the switch means 31, for example, a pair of transistors 31A and 31B is connected in series between ground and node 22. The other pair of transistors 31C and 31D thereof are connected in series between node 21 and ground. The intermediate terminals of transistors 31A and 31B are connected to the bottom plate of C1. The intermediate terminals of the other transistors 31C and 31D are connected to the top plate of C1. The transistors of switch means 32 and 33, that are associated with C2 and C3, are connected in a similar manner. The gate electrodes of the switching transistors are driven by ones of the four-phase clock-timing control signals 1-6 from the source 36. When the control signal on the gate electrode of a transistor is a positive-enabling pulse, the associated FET conducts and operates as a closed switch. Conversely, when the control signal on the gate electrode is low, the FET is non-conducting or cut off and operates as an open switch.

Figure 2:
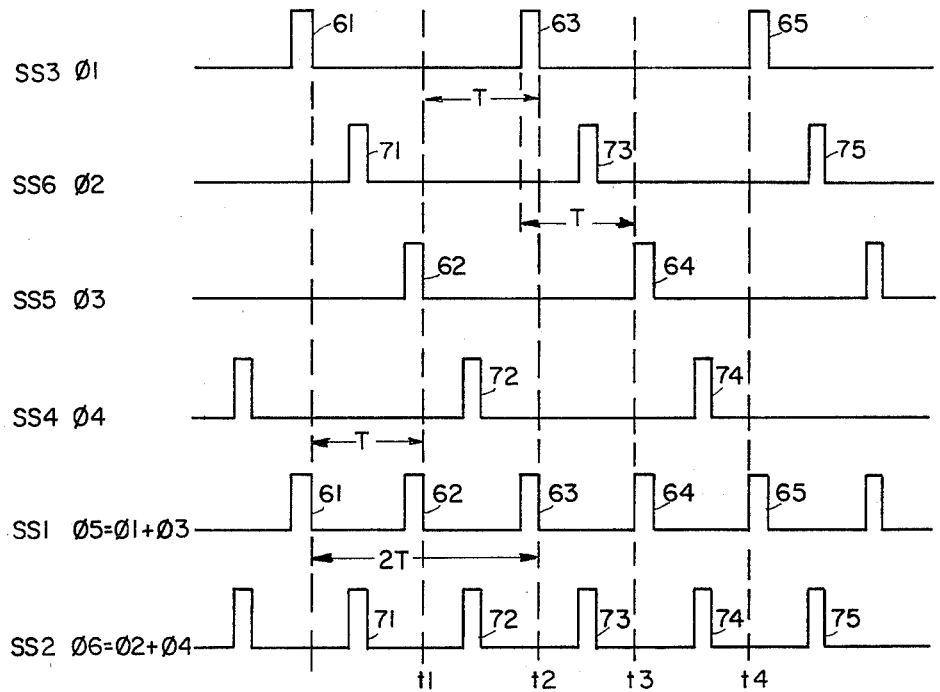
FIG. 2 is timing control signal waveforms for driving integrated switching transistors in FIG. 1.

The source 36 provides six different digital timing control signals 1-6 on lines 51-56, respectively. Only the control signals 1 and 4 are applied to the gate electrodes of associated transistors 32A/32C and 32B/32D. Similarly, the individual control signals 3 and 2 are applied to the gate electrodes of transistors 33A/33C and 33B/33D, respectively. Finally, the individual control signals 5 and 6 are applied to the gate electrodes of transistors 31A/31C and 31B/31D. The clock signal 5, however, is actually the sum of the signals 1 and 3, whereas 6 is the sum of the signals 2 and 4. In practice, therefore, the source 36 need only produce four digital control signals. The signals 1 and 3 are then both applied on lines 55A and 55B for producing the clock signals 5 there. Similarly, both of the control signals 2 and 4 are applied to lines 56A and 56B for producing the other clock signal 6 there. The signals 5 and 6, however, are useful in illustrating and explaining the operation of this invention. These digital control signals 5 and 6 contain non-overlapping pulses that are essentially 180° out of phase with respect to each other in that one is low when the other is high, as is illustrated in FIG. 2. The duty cycle of 5 and 6 are normally at least slightly less than 50% to provide adequate settling time for these signals. The switching frequency of 5 and 6 is $f=1/T$, where f is greater than the Nyquist rate and T is the period of a switching cycle associated with C1. The time interval T is measured between the negative going edges of successive positive pulses in 5, for example, which determine the sampled voltage in an associated switched capacitor. The signals 1–4 have a repetition rate that is half that of the signals 5 and 6, i.e., the signals 1–4 repeat every 2T seconds.

In operation, a pulse 61 in 5 causes transistors 31A and 31C to conduct for connecting the bottom and top plates of C1 to ground and the output of the voltage source 40, respectively, for charging C1. During this time period, the control signal 06 is low for maintaining the other transistors 31B and 31D of this switch means non-conducting for disconnecting node 22 and the ground point 17 from the bottom and top plates of C1. Transistors 32A and 32C are also responsive to the pulse 61 in 1 for connecting C2 across the output of the voltage source in the same polarity as C1. Upon termination of the pulse 61, both C1 and C2 sample and hold the source voltage. Transistors 31B and 31D are responsive to the subsequent pulse 71 (in 6 and 2) for now connecting the top and bottom plates of C1 to ground and node 22 for discharging C1 through line 45 and into the integrator 38. The capacitor C2, however, holds the source voltage until the next occurring pulse 72 in 4 and 6, at which time C2 is connected between ground and node 22 by the operation of transistors 32B and 32D for discharging C2 into the integrator. Reference to the waveform for 5 and 6 reveals that C1 stores the source voltage for a time interval of approximately T/2. The capacitor C2, however, stores the sampled source voltage for a time interval of at least T, and which is approximately 3T/2 here. This operation of the switch means 31 and 32 in periodically-repetitively charging and discharging C1 and C2 causes an electrical charge to flow in line 45.

The transistors 33B and 33D are responsive to the pulse 71 in 2 and 6 for connecting the top and bottom plates of C3 between ground and node 22 for discharging C3 into the integrator. The other transistors 33A and 33C thereof are then responsive to the subsequent or next pulse 62 that occurs in 3 and 5 for connecting C3 across the output of the source 40 in the reverse direction. The capacitor C3 then samples the source voltage on termination of the pulse 62 and stores the sampled voltage until receipt of the next enabling-positive pulse 73 in 2. This control pulse causes transistors 33B and 33D to again reverse the connection of C3 between ground and node 22 for now discharging C3 into the integrator. The capacitor C3 also stores the sampled source voltage for a time interval of at least T, and which is approximately 3T/2 here. This operation of the switch means 31–33 in periodically charging and discharging the associated capacitors C1, C2 and C3 causes the circuit 10 to simulate a source resistor across nodes 21 and 22. The simulated source resistor in FIG. 1 is substantially insensitive to both top and bottom plate parasitic capacitance effects associated with the integrated capacitors C1–C3 since all plates thereof are switched between ground and either the output of a voltage source or a virtual ground potential.

It is necessary that the circuit 10 not provide feedthrough of the input-source voltage $v_s$ to the output node 22. Consideration of the circuit 10 reveals that there is no direct connection between nodes 21 and 22. Reconsideration of the operation of this circuit also reveals that at least one pair of the transistors of each switch means is always non-conducting. This prevents a direct connection being momentarily made between the input and output nodes. Stated differently, there may never be an overlap of the enabling-positive pulses in 5 and 6 such as would cause transistors 31B and 31C, for example, to simultaneously conduct. This means that the positive pulses in 5 and 6 must be non-overlapping. Thus, it is seen that the circuit 10 performs a sample-hold function in transferring charge between the input node 21 and the output node 22 so as to prevent feedthrough of the input-source voltage between these nodes. An analytical description of the differential charge flow in circuit 10 is readily obtained when the capacitances of C2 and C3 are the same value, i.e., C2=C3.

The discrete time representation of differential charge caused in line 45 by C1 is $$\Delta q1(nT) = -C1 v_s(nT-T/2) \qquad (1)$$

Similarly, the differential change caused there by C2 and C3 is $$\Delta q2(nT) = -C2 v_s(nT-3T/2) \qquad (2)$$

If the capacitance of C1 is also equal to that of C2, i.e., C1=C2=C3=C, then the net differential charge in line 45 is obtained by combining equations (1) and (2) and is representable as $$\Delta q(nT) = -C\{v_s(nT-T/2) + v_s(nT-3T/2)\} \qquad (3)$$

Taking the z-transformation of equation (3), the net differential charge-voltage relationship for the circuit 10 in the z-domain is $$\Delta Q(z) = -C(1+z^{-1})(V_s(z)z^{-1/2}) \qquad (4)$$

where z is the operator in the z-domain and the term $z^{-1/2}$ in the expression for voltage on the right side of equation (4) means that the circuit 10 provides a time delay of T/2 seconds for an input voltage at node 21. This has no effect on the frequency response of a filter connected to node 22 and driven by the circuit 10. The general representation of the differential charge-voltage relationship for a bilinear resistor is known to be $$\Delta Q(z) = T/2R(1+z^{-1})V(z) \qquad (5)$$

Comparison of equations (4) and (5) reveals that the circuit 10 simulates a bilinear source resistor having a resistance $R = -T/2C$, where C1=C2=C3=C. The magnitude of the capacitance C and the switching frequency are varied for changing the value of the bilinear resistance simulated by the circuit.

Although this invention is described in relation to preferred embodiments thereof, variations and modifications will occur to those skilled in the art. By way of example, the capacitances of C1, C2 and C3 may be different values or the same values, the capacitances of only C2 and C3 may be the same value, and the capacitance of either C2 or C3 may be zero for presenting an open circuit across it. It appears that the circuit 10 simulates a source resistor which is other than a bilinear resistor when the capacitances of C1, C2 and C3 are not all the same value. Also, the circuit 10 may be realized with integrated circuit technologies other than MOS and in other than fully integrated form. The circuit 10 may also be fully implemented with discrete components and with only a portion thereof in integrated circuit form. Further, the switch means may comprise other types of switching elements such as discrete transistors, mechanical switches, relays, and other types of integrated switches. Additionally, the durations of the enabling pulses in the control signals may be varied in that occurrences thereof may be periodic rather than ordered. Further, the time delays between the pulses in 3 and 2 and in 1 and 4 may be less than or greater than T seconds, although the circuit will then no longer simulate a bilinear source resistor. The scope of this invention is therefore determined from the attached claims rather than from the aforementioned detailed descriptions of preferred embodiments thereof.

What is claimed is:

1. An integratable switched capacitor circuit for simulating a source resistor comprising:
a first node for electrical connection to the output terminal of a voltage souce that is associated with a ground reference potential;
a second node for connection to a virtual ground potential;
first and second capacitor means C1 and C2, each having a pair of terminals;
first switch means periodically operative in first and second non-overlapping switch states for periodically electrically connecting one and other terminals of C1 to ground and said first node, respectively, and electrically connecting said one and other terminals of C1 to said second node and ground, respectively, for charging C1 with the source voltage and discharging C1 into the second node, respectively; said first switch means being operative in each of said first and second switch states once during each T second time interval, where T is the difference between times of termination of adjacent first switch states and $f=1/T$ is the sampling frequency for C1; and
second switch means being periodically operative in third and fourth non-overlapping switch states for periodically connecting one and other terminals of C2 to ground and said first node, respectively, and electrically connecting said one and other terminals of C2 to said second node and ground, respectively, for charging C2 with the source voltage and discharging C2 into the second node, respectively; said second switch means being operative for terminating a third switch state at a first time which causes C2 to sample the voltage at said first node, for causing C2 to hold the sampled voltage, and for subsequently operating in a fourth state for discharging C2;
said circuit simulating a source resistor across said nodes when said first node is connected to the output terminal of a voltage source.

2. The circuit according to claim 1 comprising third capacitor means C3 having a pair of terminals, and third switch means periodically operative in fifth and sixth non-overlapping switch states for periodically electrically connecting one and other terminals of C3 to ground and said first node, respectively, and electrically connecting said one and other terminals of C3 to said second node and ground, respectively, for charging C3 with the source voltage and discharging C3 into the second node, respectively; said third switch means being operative for terminating a fifth switch state at a second time that is different from said first time which causes C3 to sample the voltage at said first node, for causing C3 to hold the sampled voltage, and for subsequently operating in a sixth state for discharging C3.

3. The circuit according to claim 2 wherein said second and third switch means are operative for causing C2 and C3 to hold a sampled voltage for at least a time interval T.

4. The circuit according to claim 3 wherein said second and third switch means terminate third and fifth switch states at generally the same time that said first switch means terminates associated first switch states.

5. The circuit according to claim 4 wherein said second switch means operates in a fourth switch state for discharging C2 prior to initiation of every other first switch state.

6. The circuit according to claim 5 wherein said third switch means operates in a sixth switch state for discharging C3 prior to initiation of alternate ones of the first switch states that are different from the aforementioned every other first switch states.

7. The circuit according to claim 6 wherein said third and fifth switch states correspond to adjacent first switch states that are separated by a time interval T, and associated ones of said fourth and sixth switch states correspond to adjacent second switch states that are spaced generally $3T/2$ from first switch states corresponding to associated third and fifth switch states.

8. The circuit according to claim 2 wherein the capacitances of C2 and C3 are the same value.

9. The circuit according to claim 8 wherein the capacitances of C1, C2 and C3 are all the same value C and the circuit simulates a bilinear source resistor having a resistance $R=-T/2C$ between said nodes when the circuit is characterized by the bilinear transformation $s=2/T(z-1/z+1)$, where s is the Laplace operator, $f=1/T$ is the switching frequency, and z is the operator in the z-domain.

10. The circuit according to claim 2 or 9 wherein each of said capacitor means comprises an integrated capacitor, the circuit being substantially insensitive to both top and bottom plate parasitic capacitance effects of the integrated capacitors when the first and second nodes are connected to the output of a voltage source and a virtual ground potential, respectively.

11. An integratable switched capacitor circuit for simulating a source resistor comprising:
a first node for electrical connection to the output terminal of a voltage source that is associated with a ground reference potential;
a second node for connection to a virtual ground potential;
first and second capacitors C1 and C2, each having a pair of terminals;
first switch means alternately operative in first and second non-overlapping switch states; operation of said first switch means in the first state electrically connecting one and other terminals of C1 to ground and said first node for causing C1 to sample the source voltage; operation of said first switch means in said second switch state electrically connecting said one and other terminals of C1 to said second node and ground for discharging C1 into said second node; said first switch means being operative in the first and second switch states at different times during each T second time interval, where T is the difference between times of termination of adjacent first switch states and $f=1/T$ is the sampling frequency for C1; and second switch means alternately operative in third and fourth non-overlapping switch states, operation of said second switch means in the third switch state electrically connecting one and other terminals of C2 to ground and said first node for causing C2 to sample the source voltage; operation of said second switch means in the fourth switch state electrically connecting said one and other terminals of C1 to said second node and ground for discharging C2 into said second node; said second switch means being operative for terminating a third switch state at a first time that is the same time as termination of a first switch state for causing C2 to sample the voltage at said first node at the same time that C1 samples this voltage, for causing C2 to hold the sampled voltage for at least a time interval T, and for subsequently operating in a fourth state for discharging C2 prior to initiation of the next first switch state;

said circuit simulating a source resistor across said nodes when said first node is connected to the output terminal of a voltage source and said second node is connected to a virtual ground potential.

12. The circuit according to claim 11 comprising a third capacitor C3 having a pair of terminals, and third switch means alternately operative in fifth and sixth non-overlapping switch states; operation of said third switch means in a fifth switch state electrically connecting one and other terminals of C3 to ground and said first node for causing C3 to sample the source voltage; operation of said third switch means in said sixth switch state electrically connecting said one and other terminals of C3 to said second node and ground for discharging C3 into said second node; said third switch means being operative for terminating a fifth switch state at a second time spaced a time interval T from said first time so that said switched capacitors C3 and C2 alternately sample the source voltage at said first node in time intervals T and at times that said first switch means terminates a first switch state at which C1 also samples this voltage, for causing C3 to hold the sample voltage for at least a time interval T following termination of a fifth switch state, and for subsequently operating in a sixth switch state for discharging C3 prior to initiation of the next first switch state.

13. The circuit according to claim 12 wherein the capacitances of C1, C2 and C3 are all the same value C and the circuit simulates a bilinear source resistor having a resistance $R=-T/2C$ between said nodes when the circuit is characterized by the bilinear transformation $s=2/T(z-1/z+1)$, where s is the Laplace operator, $f=1/T$ is the switching frequency, and z is the operator in the z-domain.

14. The circuit according to claim 12 wherein each of said capacitor means comprises an integrated capacitor, the circuit being substantially insensitive to both top and bottom plate parasitic capacitance effects of the integrated capacitors when the first and second nodes are connected to the output of a voltage source and a virtual ground potential, respectively.

* * * * *